United States Patent
Kolias et al.

(10) Patent No.: US 9,019,036 B2
(45) Date of Patent: Apr. 28, 2015

(54) MULTIPLE E-PROBE WAVEGUIDE POWER COMBINER/DIVIDER

(75) Inventors: Nicholas J. Kolias, Winchester, MA (US); Gabriel M. Rebeiz, San Diego, CA (US)

(73) Assignee: Raytheon Company, Waltham, MA (US)

( * ) Notice: Subject to any disclaimer, the term of this patent is extended or adjusted under 35 U.S.C. 154(b) by 329 days.

(21) Appl. No.: 13/103,454

(22) Filed: May 9, 2011

(65) Prior Publication Data

US 2012/0007650 A1 Jan. 12, 2012

Related U.S. Application Data

(60) Provisional application No. 61/332,944, filed on May 10, 2010.

(51) Int. Cl.
| | |
|---|---|
| *H01P 5/12* | (2006.01) |
| *H03F 3/04* | (2006.01) |
| *H01P 3/00* | (2006.01) |
| *H01P 5/10* | (2006.01) |

(52) U.S. Cl.
CPC .. *H01P 5/12* (2013.01); *H01P 3/00* (2013.01); *H01L 2924/1903* (2013.01); *H03F 3/04* (2013.01); *H01P 5/10* (2013.01)

(58) Field of Classification Search
CPC ............... H01P 5/12; H01P 3/00; H03F 3/04; H01L 2924/1903
USPC ........... 333/26, 125, 208, 101, 135–137, 248; 330/126, 250, 125
See application file for complete search history.

(56) References Cited

U.S. PATENT DOCUMENTS

| | | | |
|---|---|---|---|
| 3,670,268 A | 6/1972 | Connerney | |
| 6,154,183 A * | 11/2000 | Wolf | 343/786 |

(Continued)

FOREIGN PATENT DOCUMENTS

| | | |
|---|---|---|
| JP | 61018204 | 1/1986 |
| JP | 11195924 | 7/1999 |
| RU | 2203701 CS | 5/2003 |

OTHER PUBLICATIONS

Notification Concerning Transmittal of International Preliminary Report on Patentability, PCT/US2011/035719, date of mailing Feb. 14, 2013, 2 pages.

(Continued)

*Primary Examiner* — Benny Lee
*Assistant Examiner* — Rakesh Patel
(74) *Attorney, Agent, or Firm* — Daly, Crowley, Mofford & Durkee, LLP

(57) ABSTRACT

A power combiner/divider having a waveguide, a plurality of amplifiers disposed on a supporting structure, a plurality of probes, each one having a first end electrically coupled to an output of a corresponding one of the plurality of amplifiers and a second end projecting outwardly from the supporting structure and into the waveguide. The probes are disposed in a common region of the waveguide. The region has a common electric field maximum within the waveguide. A first portion of the probes proximate the sidewalls have lengths different from a second portion of the probes disposed in a region distal from the sidewalls of the waveguide. The waveguide is supported by the support structure. The power combiner is a monolithic microwave integrated circuit structure.

22 Claims, 14 Drawing Sheets

(56) References Cited

U.S. PATENT DOCUMENTS

| 6,271,728 B1* | 8/2001 | Wallace et al. ............... 330/286 |
| 2002/0030553 A1 | 3/2002 | Cayrou et al. |
| 2008/0240656 A1 | 10/2008 | Rollin et al. |

OTHER PUBLICATIONS

Written Opinion of the International Searching Authority, PCT/US2011/035719, date of mailing Feb. 14, 2013, 9 pages.
Notification of Transmittal of the International Search Report and the Written Opinion of the International Searching Authority, or the Declaration, PCT/US2011/035719, date of mailing Jan. 14, 2013, 6 pages.
Written Opinion of the International Searching Authority, PCT/US2011/035719, date of mailing Jan. 14, 2013, 10 pages.
Invitation to Pay Additional Fees and, Where Applicable, Protest Fee, PCT/US2011/035719, Jul. 19, 2011.
Kolias et al. "A Monopole-Probe-Based Quasi-Optical Amplifier Array"; IEEE Transactions on Microwave Theory and Techniques, vol. 45, No. 8, pp. 1204-1207. Jan. 1997.
Kolias et al. "A Microstrip-Based Unit Cell for Quasi-Optical Arrays"., IEEE Microwave and Guided Wave Letters, vol. 3 No. 9, pp. 330-333, Sep. 1993.
Nai-Shoo et al., "40-W CW Broad-Band Spatial Power Combiner Using Dense Finline Arrays"., IEEE Transactions on Microwave Theory and Techniques vol. 47, No. 7, pp. 1070-1076, Jul. 1999.
Jiang et al., A Ka-Band Power Amplifier Based on the Travelling-Wave Power-Dividing/Combining Slotted-Waveguide Circuit, IEEE Transaction on Microwave Theory and Techniques, vol. 52, No. 2. Feb. 2004.
Jiang et al.,A Ka-Band Power Amplifier Based on a Low-Profile Slotted-Waveguide Power-Combining/Dividing Circuit, IEEE Transactions on Microwave Theory and Techniques, vol. 51, No. 1, Jan. 2004.

* cited by examiner

MULTIPLE E-PROBE WAVEGUIDE POWER COMBINER/DIVIDER

CROSS REFERENCE TO RELATED APPLICATIONS

This application claims priority to provisional application Ser. No. 61/332,944, titled "MULTIPLE E-PROBE WAVEGUIDE POWER COMBINER/DIVIDER", filed May 10, 2010, which is incorporated by reference herein in its entirety.

TECHNICAL FIELD

This disclosure relates generally to power combiner/dividers and more particularly to waveguide power combiner/dividers.

BACKGROUND

As is known in the art, many applications require the combination or reciprocally, division (i.e., distribution), of radio frequency (rf) energy from or to many sources. These power combiner/dividers may take many forms in many transmission line media; such as waveguide, microstrip and strip transmission line.

For example, power combiners using waveguide transmission are described in papers entitled "A Ka-Band Power Amplifier Based on the Travelling-Wave Power-Dividing/Combining Slotted-Waveguide Circuit", by Jiang et al, IEEE Transactions on Microwave Theory and Techniques, Vol. 52, No, 2. February 2004 and "A Ka-Band Power Amplifier Based on a Low-Profile Slotted-Waveguide Power-Combining/Dividing Circuit", by Jiang et al. IEEE Transactions on Microwave Theory and Techniques, Vol. 51, No. 1, January 2004, "A Monopole-Probe-Based Quasi-Optical Amplifier Array", by Kolias et al; IEEE Transactions on Microwave Theory and Techniques, Vol. 45, No. 8, pages 1204-1207. January 1997; "A Microstrip-Based Unit Cell for Quasi-Optical Arrays", by Kolias, et al., IEEE Microwave and Guided Wave Letters, Vol. 3 No. 9, pages 330-33, September 1993; and, "40-W CW Broad-Band Spatial Power Combiner Using Dense Finline Arrays", Nai-Shoo et al., IEEE Transactions on Microwave Theory and Techniques Vol. 47, No. 7, pages 1070-1076, July 1999.

One application where power combining is desirable is in combining power from a plurality of power transistors formed in a monolithic microwave integrated circuit (MMIC). Here, because of the small geometries involved, a relatively small power combiner is required. More particularly, traditionally, milli-meter (mm)-wave monolithic microwave integrated circuits have been designed in two-dimensions (i.e., planar) that has limited power-combining approaches to planar, corporate combiners. While the papers referred to above describe a 3D approach to power combining, the arrangements described therein do not readily or practically lend themselves to MMICs because of their large size.

SUMMARY

In accordance with the present disclosure, a microwave structure is provided having: a waveguide; a plurality of probes, each one having a first end electrically coupled to an output and a second end projecting outwardly from the supporting structure and into the waveguide, the probes being spaced from a rear wall of the waveguide a distance n ($\lambda/4$) +/−0.2 $\lambda$, where $\lambda$ is the nominal operating wavelength of energy passing between the probes and the waveguide and n is an odd integer.

With such an arrangement, the power combiner is able to combine power from amplifiers formed as an MMIC.

In one embodiment, the microwave structure includes a plurality of amplifiers and wherein each one of the first ends is coupled to a corresponding one of the amplifiers.

In one embodiment, the probes are disposed in a common region of the waveguide having maximum electric field coupling to the probes.

In one embodiment, the probes are disposed in a common region of the waveguide, such region having a common electric field maximum within the waveguide.

With such an arrangement, coupling into the waveguide using E-field probes provides an ultra low-loss method for combining large numbers of amplifier cells.

In accordance with the present disclosure, a microwave structure is provided having: a waveguide; a plurality of amplifiers disposed on a supporting structure; a plurality of probes, each one having a first end electrically coupled to an output of at least one of the plurality of amplifiers and a second end projecting outwardly from the supporting structure and into the waveguide, the probes being spaced from a rear wall of the waveguide a distance n ($\lambda/4$) +/−0.2 $\lambda$, where $\lambda$ is the nominal operating wavelength of energy passing between the probes and the waveguide and n is an odd integer.

With such an arrangement, the power combiner is able to combine power from amplifiers formed as an MMIC.

In one embodiment, the waveguide here, for example, is a rectangular waveguide and the probes are E-field probes that extend parallel to narrow sidewalls of the waveguide and are arrayed along a direction perpendicular to the narrow sidewalls of the waveguide and wherein the energy passes through the waveguide along a direction parallel to the sidewalls of the waveguide.

In one embodiment, the waveguide is supported by the support structure.

In one embodiment, the support structure is a single crystal support structure.

In one embodiment, the microwave structure is a monolithic microwave integrated circuit structure.

In one embodiment, a first portion of the probes have lengths (i.e., heights) different from a second portion of the probes. In one embodiment, an additional probe is provided having a first end electrically coupled to a transmission line supported by the support structure, such additional probe being disposed in the waveguide for coupling the energy passing between the waveguide and the transmission line, such additional probe being spaced from a front wall of the waveguide a distance n($\lambda/4$)+/−0.22 $\lambda$.

In one embodiment, the probes are disposed in a common region of the waveguide having maximum electric field coupling to the probes.

In one embodiment, the probes are disposed in a common region of the waveguide, such region having a common electric field maximum within the waveguide.

With such an arrangement, coupling into the waveguide using E-field probes provides an ultra low-loss method for combining large numbers of amplifier cells.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
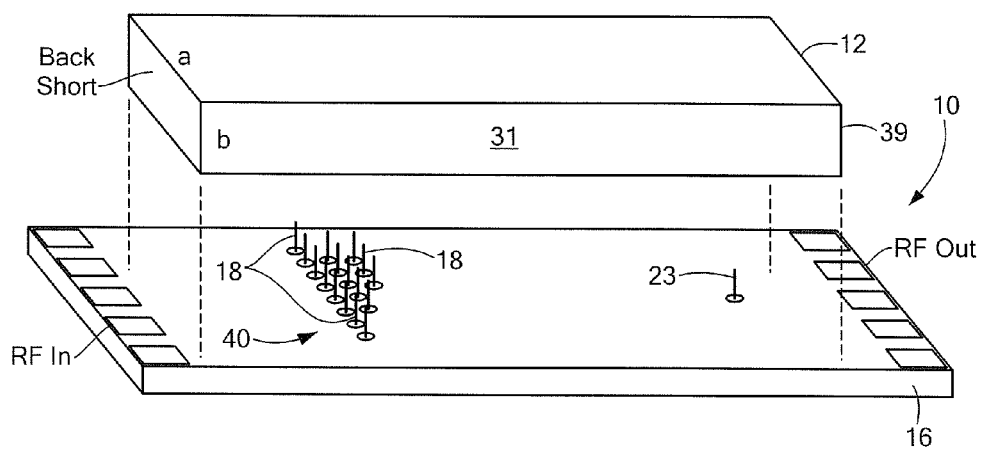
FIG. 1 is an exploded, isometric sketch of a power combiner according to the disclosure.
Figure 1A:
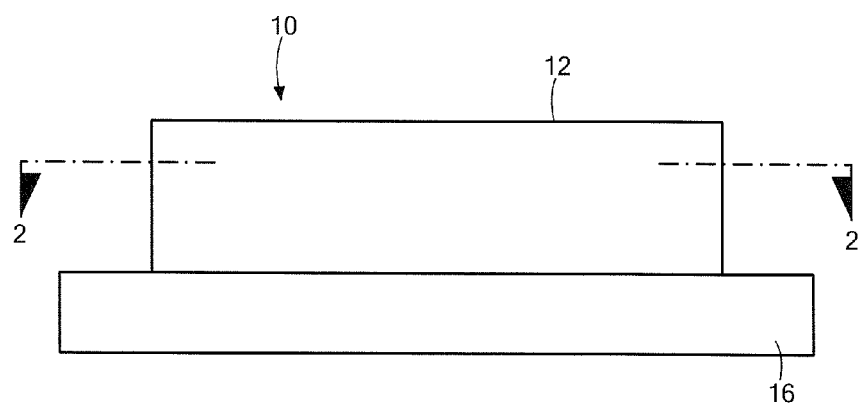
FIG. 1A is a side elevation view of the power combiner of FIG. 1.
Figure 2:
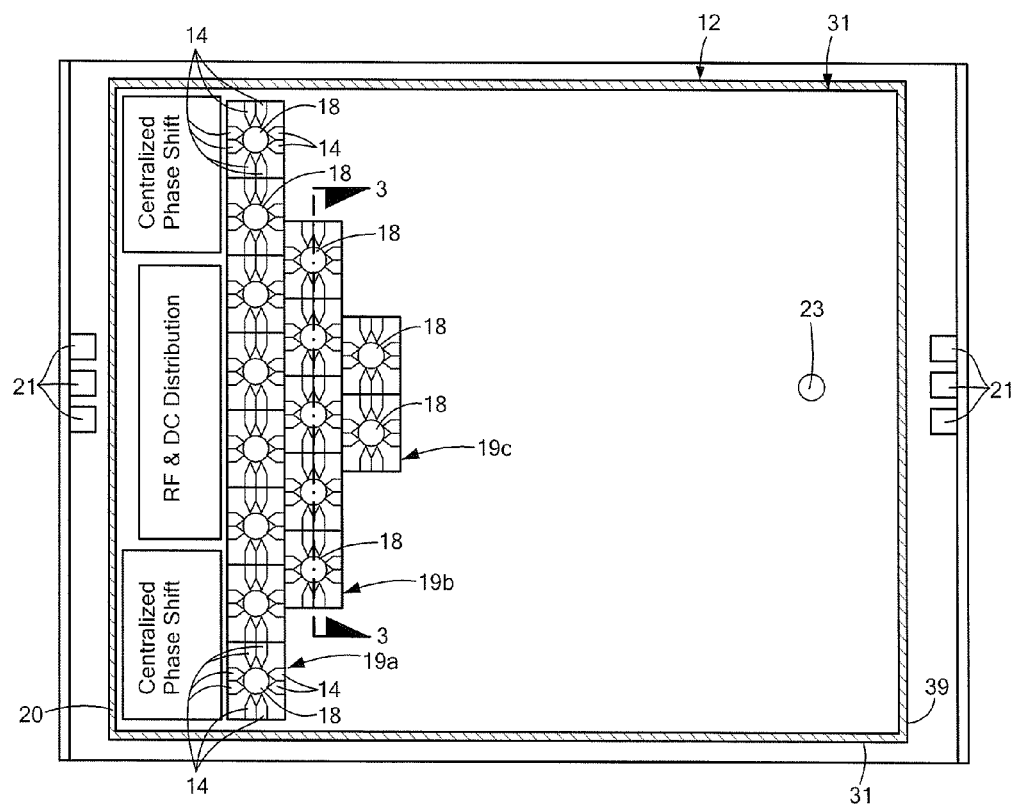
FIG. 2 is a cross sectional view of the power combiner of FIG. 1, such cross section being taken along line 2-2 of FIG. 1A.

Referring now to FIGS. 1, 1A and 2, a microwave structure, here a power combiner 10 is shown having: a waveguide 12; a plurality of transistors here arranged as amplifiers 14 (FIG. 2) disposed on a supporting structure 16 (FIG. 1); a plurality of probes (herein sometimes referred to as input probes) 18, each one having a first end electrically coupled to an output of a corresponding set of the plurality of amplifiers 14.

Figure 1B:
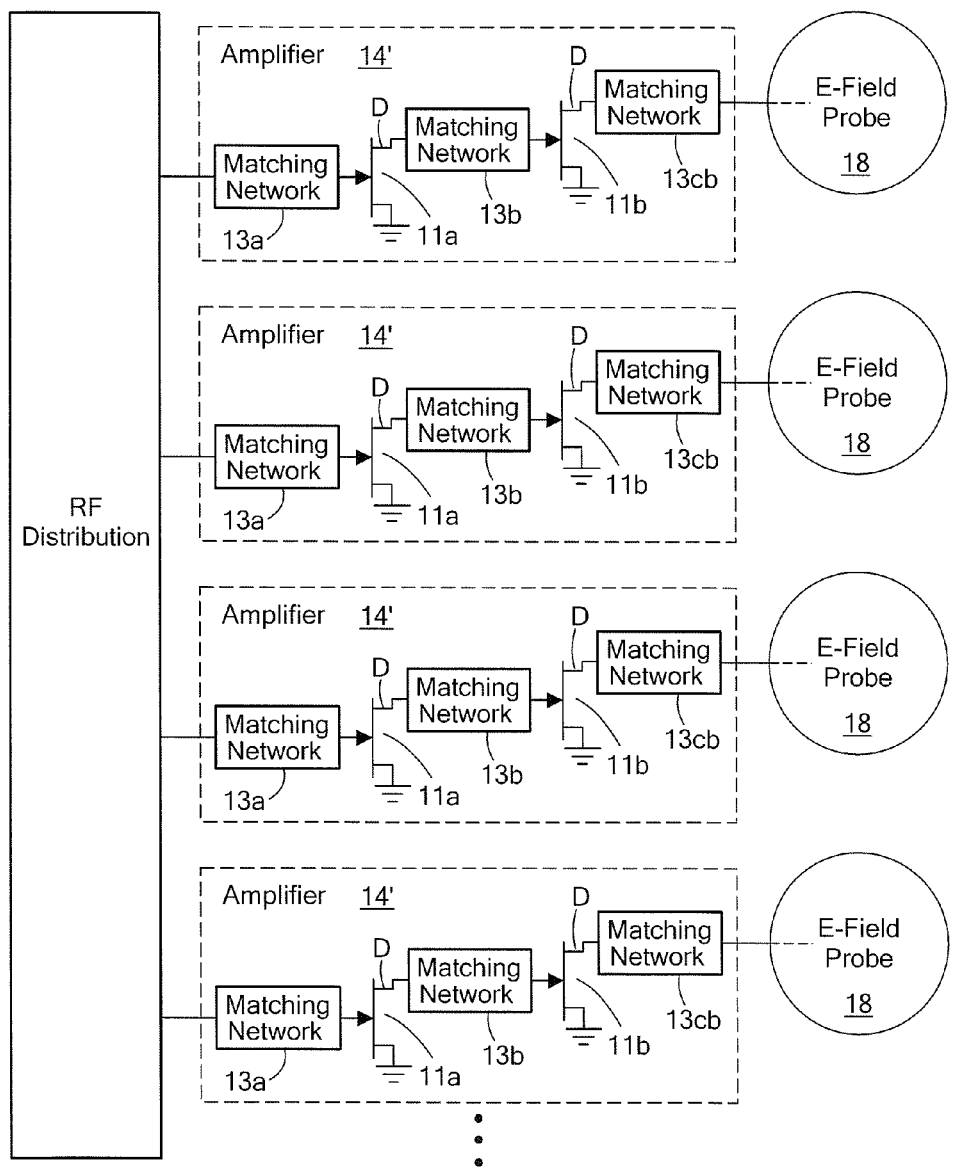
FIG. 1B is a diagrammatical sketch of an arrangement of amplifiers and probes used in the power combiner of FIG. 1 in accordance with one embodiment of the disclosure.

More particularly, FIG. 1B shown on arrangement of amplifiers 14' coupled to, in this example, four probes 18. Here, each one of the amplifiers 14' includes two cascaded transistors 11a, 11b; a first one of the transistors 11a being coupled to an output of an RF distribution network through a first impedance matching network 13a, a second one of the transistors 11b being coupled to the output electrode, here drain electrode D, of FET transistor 11a, through a second impedance matching network 13b, the output, here drain electrode D, of FET transistor 11b being coupled to the probe 18 through a third impedance matching network 13c, and the output of the third impedance matching network 13c being connected directly to the probe 18.

Figure 1C:
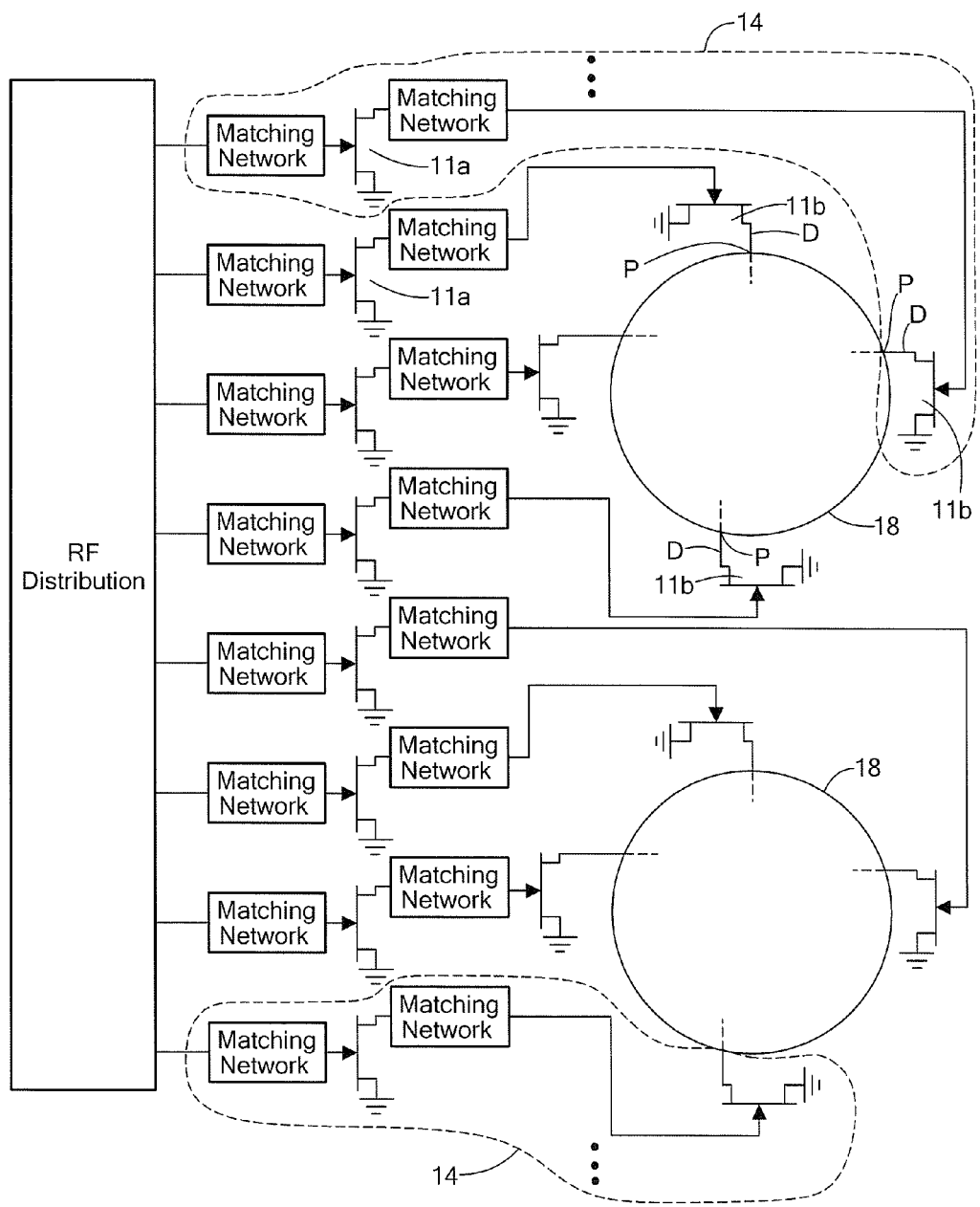
FIG. 1C is a diagrammatical sketch of an arrangement of amplifiers and probes used in the power combiner of FIG. 1 in accordance with another embodiment of the disclosure.

FIG. 1C shows another arrangement with each probe 18 being fed by a plurality of amplifiers, here four amplifiers 14 with outputs of the amplifiers 14 feeding points P distributed uniformly about a circumferential region of the probe 18. It is also noted that in this arrangement, the impedance matching network 13b of amplifiers 14' has been eliminated because here, the output electrode, here drain D electrode is connected directly to the probe 18. More particularly, as will be described, the probe 18 is formed in direct contact with the drain electrode D of the transistors 11b. Here, the length (i.e., height) of the probe 18 is selected to provide the impedance matching performed by impedance matching network 13c (FIG. 1B).

Figure 1D:
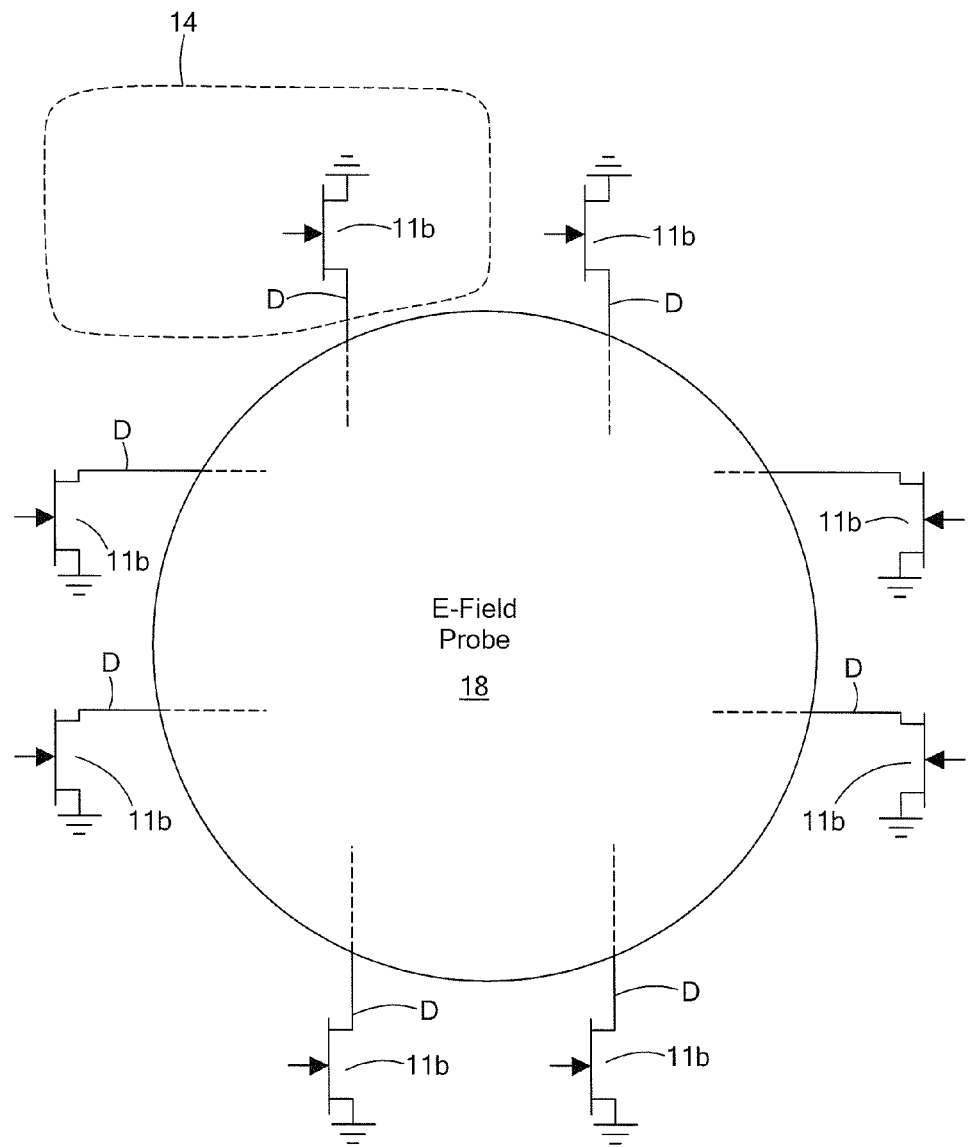
FIG. 1D is a diagrammatical sketch of an arrangement of amplifiers and probes used in the power combiner of FIG. 1 in accordance with still another embodiment of the disclosure.
Figure 3:
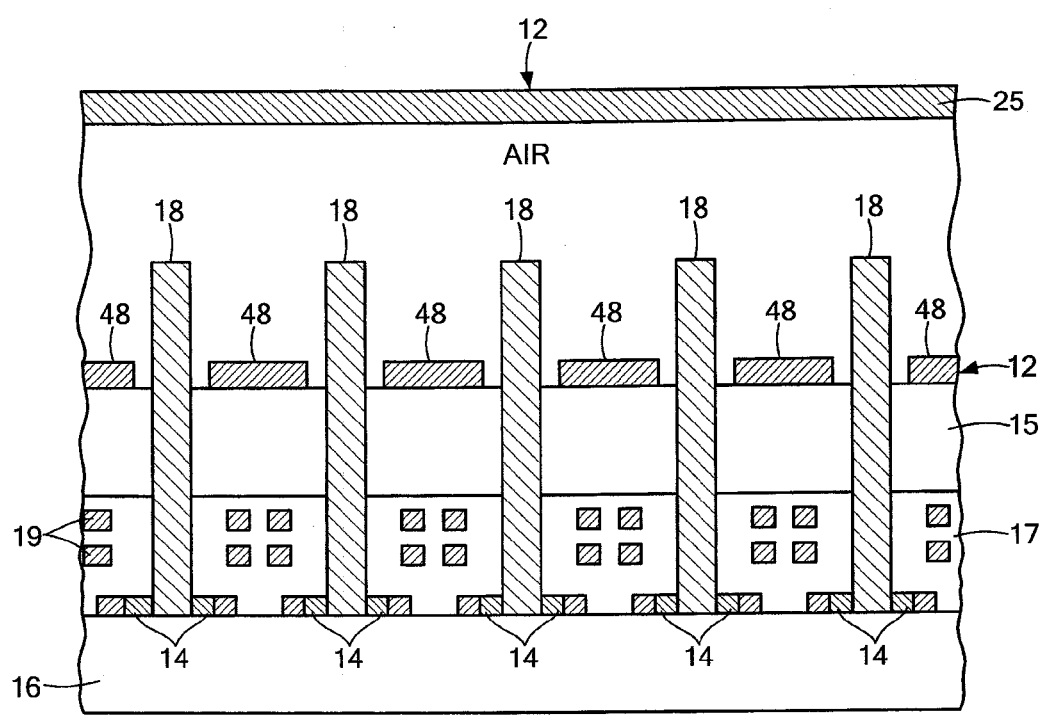
FIG. 3 is a plan view of a cross section taken along a line 3-3 passing through a portion of the power combiner of FIG. 2.

FIG. 1D shows still another embodiment, here each probe 18 is fed by eight amplifiers 14. Thus, as shown in FIG. 2, there is a set of eight amplifiers 14 and a second end projecting outwardly from the supporting structure 16 and into the interior of the waveguide 12, as shown in FIG. 3 for an exemplary one of three rows of the probes 18. The probes 18 are spaced from a rear or back wall 20 of the waveguide 12 a distance between $n(\lambda/4) - 0.2\lambda$ and $n(\lambda/4) + 0.2\lambda$ (i.e., $n(\lambda/4) +/- 0.2\lambda$), where $\lambda$ is the nominal operating wavelength of energy passing between the probes 18 and the waveguide 12 and n is an odd integer, preferably n is one to provide the most compact structure. Here, the supporting structure 16 is a single crystal substrate, such as, for example, a III-V, or IV substrate such as GaN or silicon, for example.

The amplifiers 14 are formed using conventional integrated circuit fabrication techniques in the upper planar surface of the supporting structure 16. Here the amplifiers include a FET (not shown) having the gate fed by an input signal coupled to an input pad 21 on the supporting structure 16 of the power combiner 10, a grounded source and a drain electrically connected to the probe 18.

The supporting structure 16 also has formed thereon microwave transmission lines and power lines integrally formed with the amplifiers 14 using conventional MMIC fabrication techniques, shown generally by numerical designation 19 in FIG. 3 and referred to as the Back end of line (BEOL) structure 17. Note for example power and radio frequency (rf) input and output pads 21 connected to these transmission and power lines.

A solid dielectric layer 15 (FIG. 3) is formed over the BEOL structure 17 in FIG. 3. The bottom wall 48 of the waveguide 12 is then formed over the dielectric layer 15 using any integrated circuit deposition process. Next apertures are formed in the bottom wall 48, each one of such apertures being aligned with a cluster of eight amplifiers 14 (FIGS. 2 and 3). Next the conductive probes 18 and an output probe 23 (FIGS. 1 and 2) are formed in a manner to be described in more detail below in connection with FIGS. 5A-5N. Suffice it to say here however that the sidewalls and upper wall 25 (FIG. 3) of the waveguide 12 are then formed as will be described to provide the power combiner 10. Here, the probes 18 are separated one from an adjacent other one by less than $0.1\lambda$.

As mentioned above, the probes 18 are also formed using integrated circuit fabrication techniques in a manner to be described in more detail below. Suffice it to say here, in this embodiment, there are fifteen probes 18 arranged in three rows 19a, 19b and 19c, each row extending laterally across the wide dimension of the waveguide 12 (FIG. 2). The first row 19a is closest to the back wall 20 of the waveguide 12 and such row has eight probes, as indicated. The row 19c furthest from the back wall 20 has two probes 18 disposed in a region midway between the opposing narrow sidewalls 31 (FIG. 2) of the waveguide 12, as indicated. The row 19b is disposed between the rows 19a and 19b and has five probes 18 disposed in a region midway between the opposing narrow sidewalls 31 of the waveguide 12, as indicated. It is noted that a first portion of the probes 18 in row 19a proximate the narrow sidewalls 21 of the waveguide 12 have lengths different from, here higher than, a second portion of the probes 18 disposed in a region distal from the sidewalls 21 of the waveguide 12, i.e., in a region of row 19a disposed in a region midway between the opposing narrow sidewalls 21 of the waveguide 12.

It is to be noted that here, in this embodiment, the row 19a is at a distance $\lambda/4$ from the back wall 20 of the waveguide 12 and that row 19b is at a distance $\lambda/4 + 0.09\lambda$ from the back wall 20 of the waveguide 12 and that row 19c is at a distance λ/4+0.18 λ from the back wall 20 of the waveguide 12.

It is noted that here, in this embodiment, each one of the probes 18 is coupled to a cluster of eight of the amplifiers 14 disposed radially around the probe 18. Thus, eight of the amplifiers 14 radially combine to feed each one of the E-field probes 18, as indicated more clearly in FIG. 3. Thus, here in this embodiment, there are one hundred and twenty amplifiers 14 (operating in the linear region) in the power combiner.

An additional probe 23 (sometimes referred to herein as an output probe) is provided having a first end electrically coupled to a transmission line 19 in the BEOL structure 17 (FIG. 3) supported by the support structure 16, such additional probe 23 extending from the support structure 16 vertically into the waveguide 12 for coupling the energy passing between the waveguide 12 and the transmission line 19. The additional probe 23 is spaced from a front wall 39 of the waveguide a distance n(λ/4)+/−0.2λ. In this embodiment, the distance is 0.12λ. The output probe 23 is therefore at maximum electric field. Here again, n is preferably 1.

Thus, the probes 18 are disposed in a common region 40 (FIG. 1) of the waveguide 12 having maximum electric field within the waveguide 12. The additional probe 23 is also disposed in a region having maximum electric field (i.e., standing wave maximum) within the waveguide 12.

Here the power combiner 10 is configured to operate at 45 Ghz and the waveguide 12 is an air filled, rectangular waveguide 12, here for example in this embodiment, the waveguide has a height 1400 micrometers and a width 5690 micrometers, with the narrow sidewalls (i.e., height) extending vertically (perpendicularly) from the planar upper surface of the supporting structure 16 and wide sidewalls 31 (i.e., width) extending parallel to the planar upper surface of the supporting structure 16. Thus, the probes 18 extend perpendicular to the planar upper surface of the supporting structure 16. Here, the waveguide 12 supports the TE10 dominant waveguide mode of propagation and the probes 18 are E-field probes that extend parallel to narrow sidewalls 31 of the waveguide 12 and are arrayed along a direction perpendicular to the narrow sidewalls 31 of the waveguide 12 wherein the energy passes through the waveguide 12 along a direction parallel to the sidewalls of the waveguide 12.

Here, the waveguide 12 is formed on the supporting structure 16 using integrated circuit fabrication techniques, such as photolithographic-etching, to form the power combiner 10 as a monolithic microwave integrated circuit (MMIC).

Figure 4:
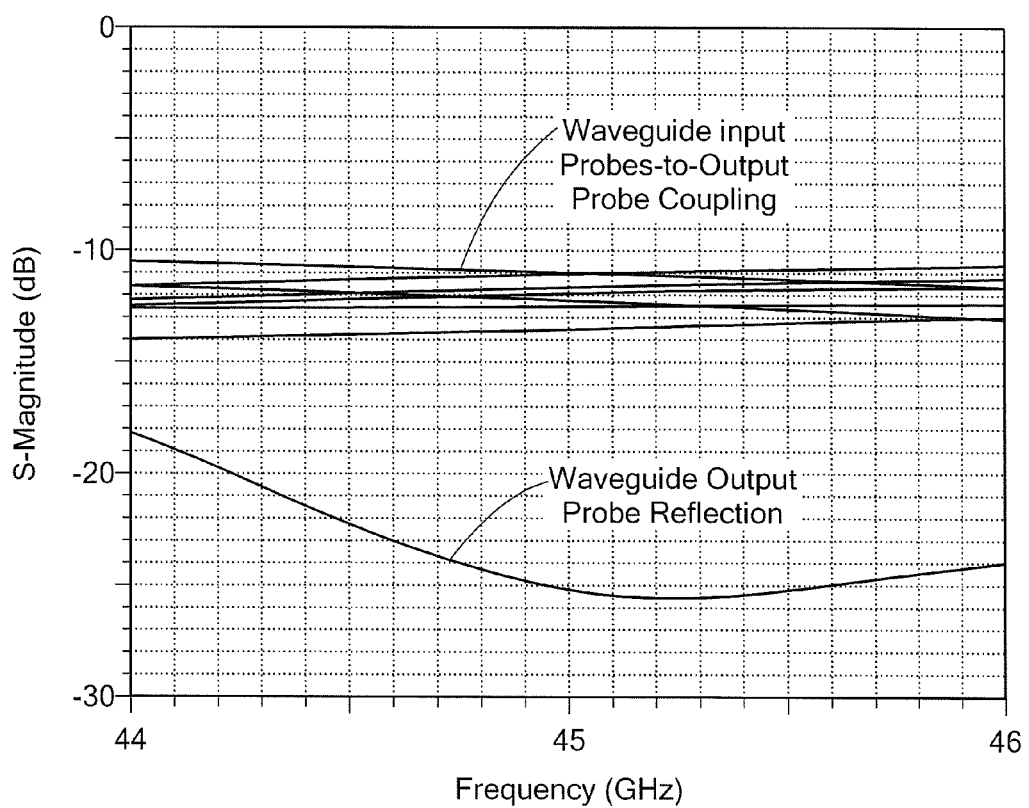
FIG. 4 is a full three-dimensional, electromagnetic computer simulation showing reflection loss magnitude of an output probe used in the power combiner of FIGS. 6A-6C as well as coupling magnitude for each of fifteen input probes used in the power combiner of FIGS. 6A-6C as a function of operating frequency of the power combiner of FIGS. 6A-6C.

More particularly, in this embodiment, there are 15 waveguide input probes 18 and a single waveguide output probe 23. The configuration of the probes 18 is denser in the center of the waveguide 12 to better match the probes 18 to the TE10 dominant waveguide mode. The spacing and height of the 15 waveguide input probes 18 are optimized such that the coupling magnitude between each of the 15 input probes 18 and the output probe 23 is approximately equal at −11.8 dB. This is illustrated in FIG. 4 which shows the waveguide output probe 23 reflection loss magnitude as well as the waveguide input probe-to-output probe coupling magnitude for each of the 15 input probes 18. Each input probe for this embodiment is matched to 50 ohms, though the technique applies equally well to other impedances. In addition the number of probes 18 and their placement can also be optimized depending on the combiner levels desired. The embodiment is also readily scaled in frequency through the reduction of waveguide dimensions and optimization of the E-field probes 18.

It is noted from FIG. 4 that the approach has a number of advantages. Compared to free-space combining, the power combiner 10 is much more compact, and by confining the fields in a waveguide 12, avoids the free-space difficulties of side-lobe generation and power collection. Also, the E-field-probes avoid the high losses of planar transmission lines 37. The ultra low loss (0.13 dB) of the combiner achieves higher efficiencies than are possible using serially combined high power configurations such as binary combiners, Wilkinson combiners, or distributed active transformers.

Figure 5A:
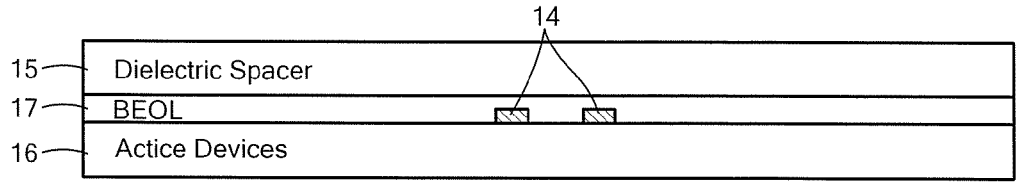
FIGS. 5A-5N and 5M'-5O' are cross sectional diagrammatical sketches showing the steps used to fabricate the power combiner of FIG. 1.
Figure 5B:
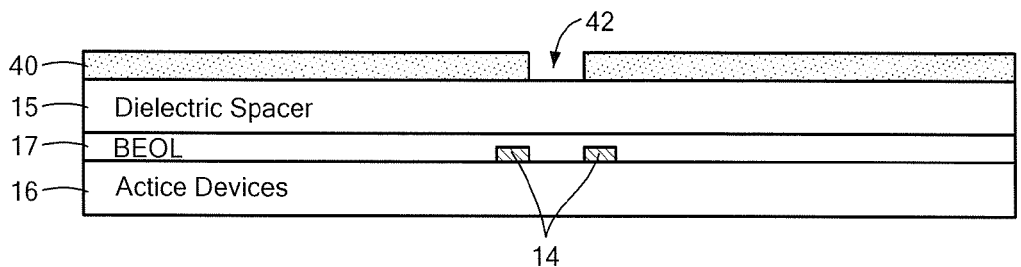
Figure 5C:
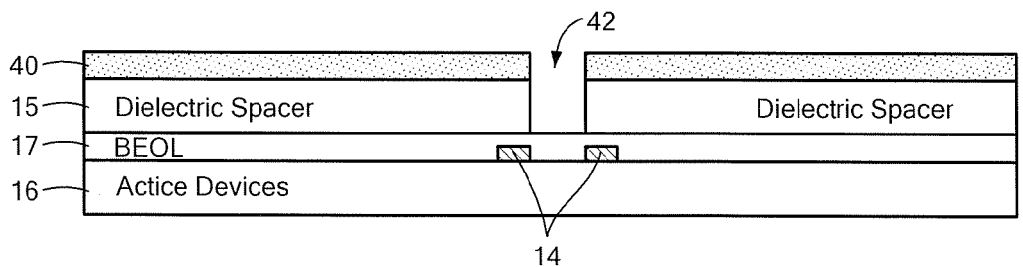
Figure 5D:
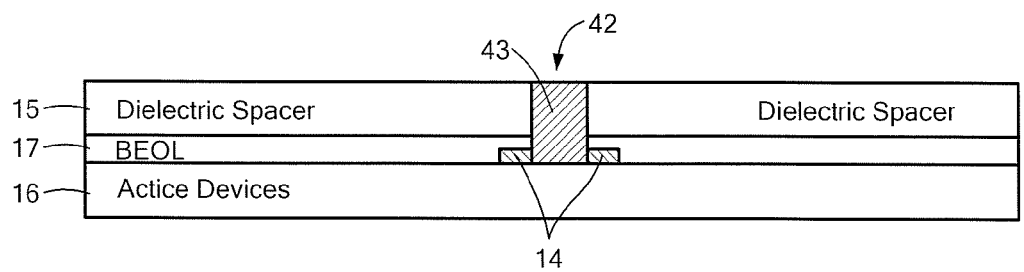
Figure 5E:
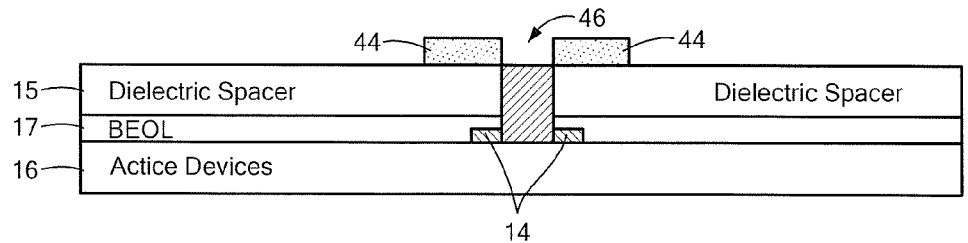
Figure 5F:
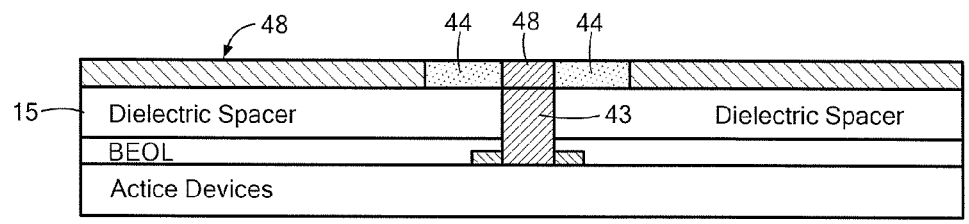
Figure 5G:
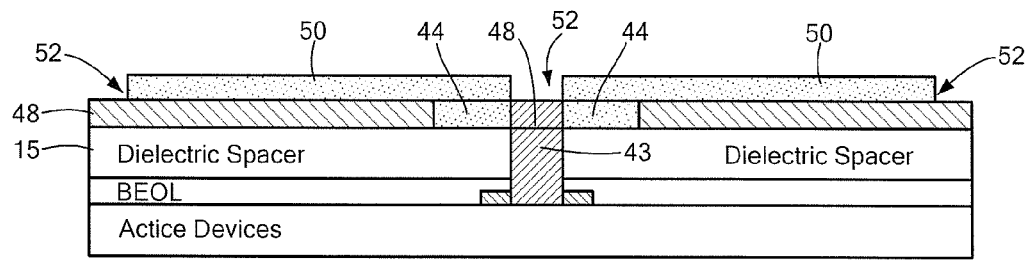
Figure 5H:
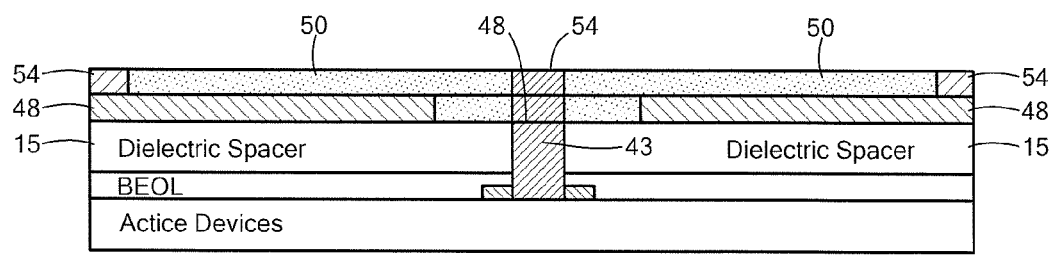
Figure 5I:
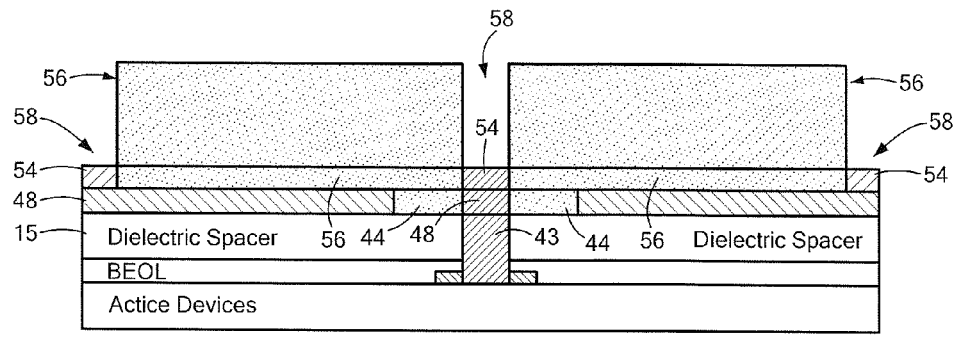
Figure 5J:
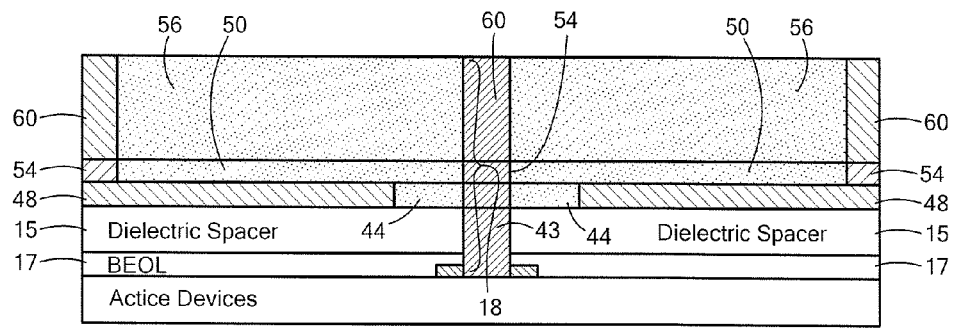
Figure 5K:
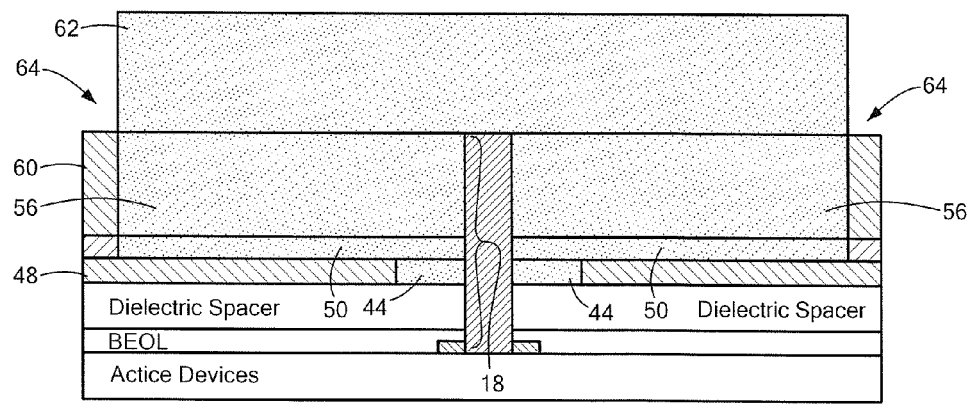
Figure 5L:
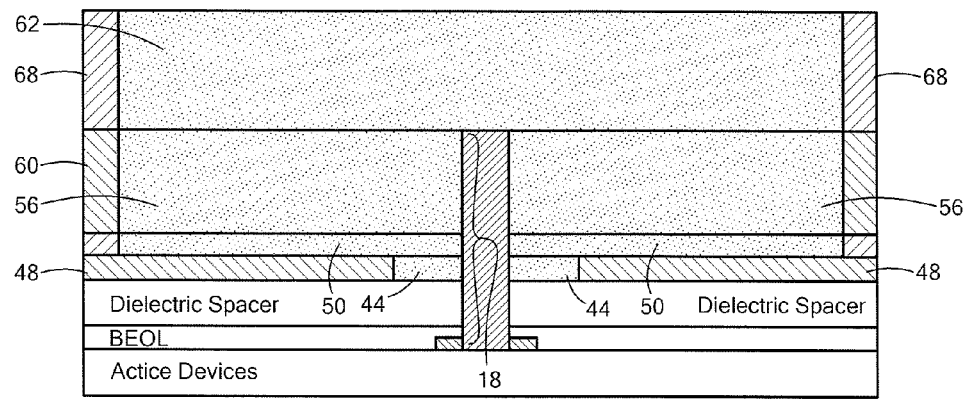
Figure 5M:
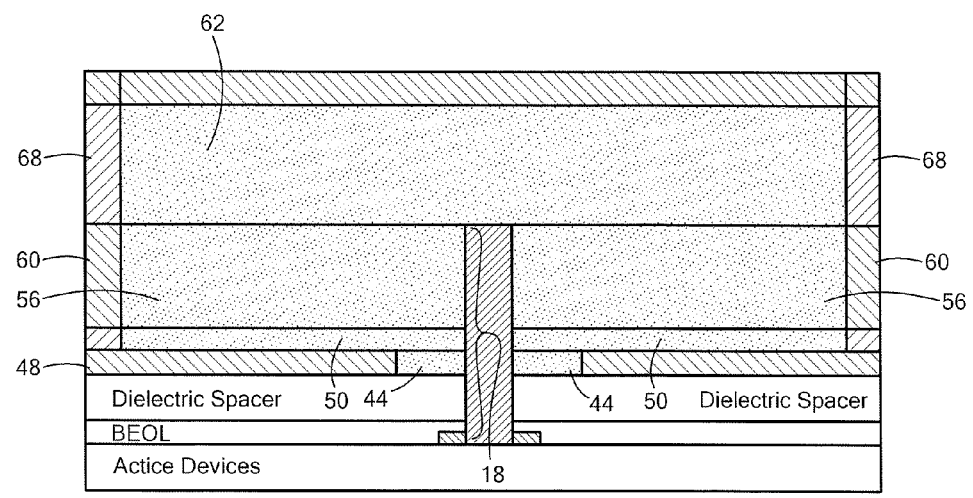
Figure 5N:
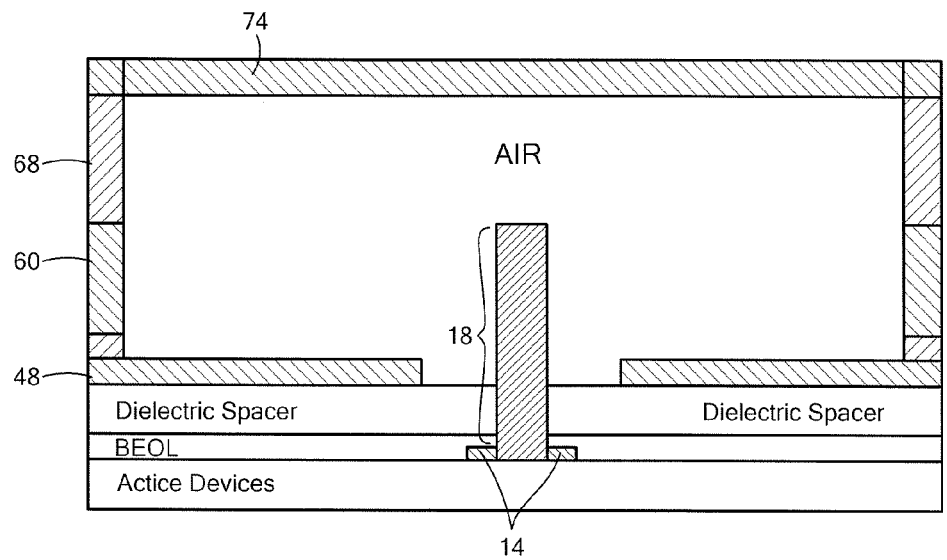
Figure 5M:
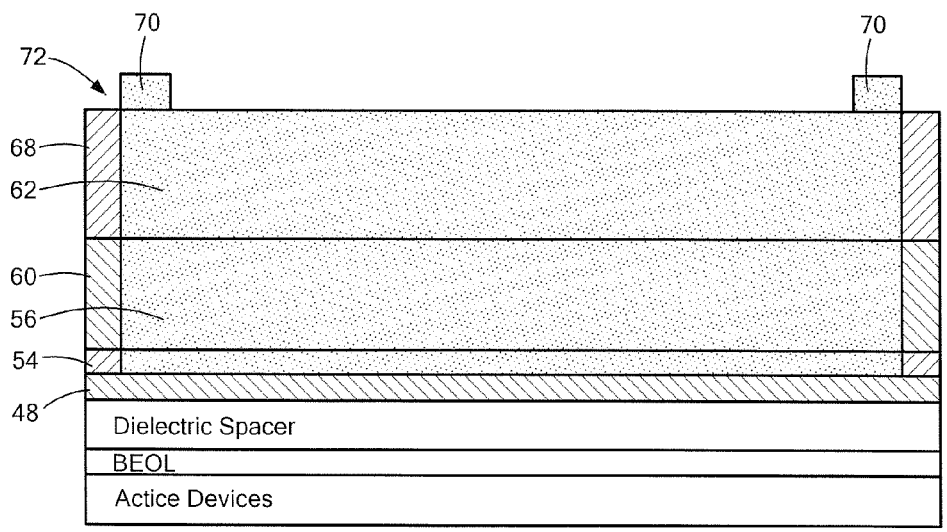
Figure 5N:
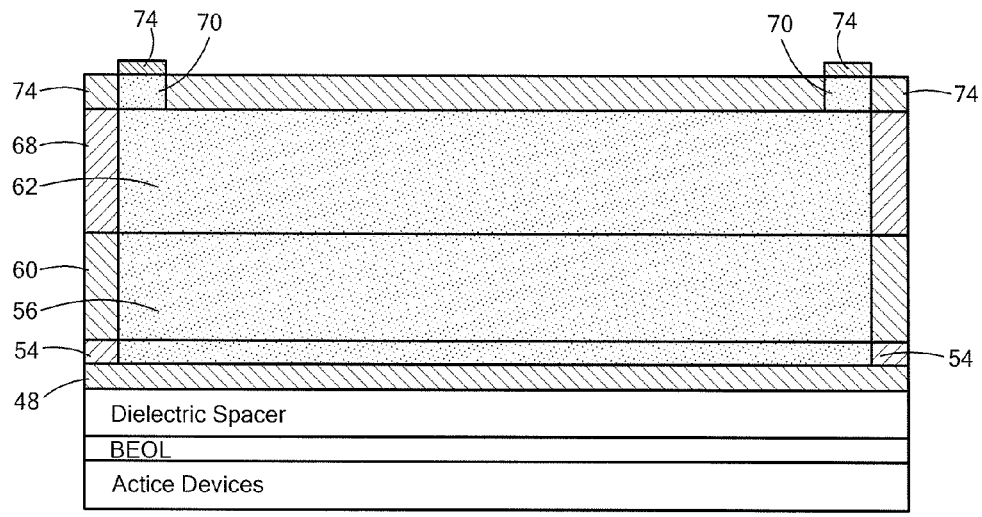

Referring now to FIGS. 5A through 5N, after forming the microwave transmission lines and power lines in the BEOL structure 17, the dielectric layer 15, here for example, B-Staged divinylsiloxane-bis-benzocyclobutene resin, sometimes referred to as BCB, is deposited over the BEOL structure 17 as shown in FIG. 5A.

Next, a photoresist layer 40 is deposited over the dielectric layer 15 as shown in FIG. 5B. Next, the photoresist layer 40 is patterned in any conventional photolithographic-etching manner to form a window 42 (FIG. 5B) therein to expose a region over the structure where one the probes 18 is to be formed; it being understood that the process shown in FIGS. 5A through 5N shows formation of an exemplary one of the probes 18; it being understood that the process is used in the formation of all of the probes 18 and therefore windows 42 would be formed in layer 40 for each one of the probes 18.

Next, the portion of the structure exposed by the window 42 is etched using any conventional etching technique (FIG. 5C) to removed the exposed portion of the dielectric layer 15 and expose the underlying portion of BEOL structure 17 where the electrode of the FET to which the probe 18 is to be connected.

Next, a conductive material 43 is deposited over the structure shown in FIG. 5C. Portions of the material 43 become deposited on the photoresist layer 40 and other portions pass through the window 42 onto the FET electrode and the resulting structure being shown in FIG. 5D after lifting off the photoresist layer 40 and the portions of the conductive layer 43 deposited on the photoresist layer 40. Note that the remaining portion 43 provides a bottom portion of the probe 18.

Next a layer 44 of photoresist is deposited over the structure and patterned as shown in FIG. 5E using conventional photolithographic-etching process to have openings 46. Next, a conductor 48 is plated onto the portions of the dielectric layer 40 exposed by the openings 46 and onto the top of conductor 42 also exposed by the openings 46, as shown in FIG. 5F.

Next, a layer 50 of photoresist is deposited over the structure and patterned as shown in FIG. 5G using conventional photolithographic-etching process to have openings 52.

Next, a conductor 54 is plated onto the portions of the conductor 48 exposed by the openings 54, as shown in FIG. 5H.

Next, a layer 56 of photoresist is deposited over the structure and patterned as shown in FIG. SI using conventional photolithographic-etching process to have openings 58. Next, Next, a conductor 64 is plated onto the portions of the conductor 54 exposed by the openings 58, as shown in FIG. 5J thereby completing the probe 18 and bottom portions sidewalls of the waveguide. It should be understood that the process may be modified so that different probes 18 may be plated to have different heights. The plating can be done manually or with robots. To obtain different size probes 18, photoresist plating steps are performed iteratively; i.e., the metal (conductor) thickness of the probe is "quantized" by the thickness of the photoresist. To make one probe shorter than another, the mask (i.e., patterned photoresist) is changed when the shortest probe is constructed so that photoresist covers the shorter probe, but not the larger probe. In this way, probes can be made with different lengths (i.e., heights).

Next, a layer 62 of photoresist is deposited over the structure and patterned as shown in FIG. 5K using conventional photolithographic-etching process to have openings 64. Next, a conductor 68 is plated onto the portions of the conductor 68 exposed by the openings 64, as shown in FIG. 5L thereby forming the upper portions of the sidewalls of the waveguide.

Next, as shown in FIGS. 5M', a layer 70 of photoresist is deposited over the structure and patterned as shown in FIG. 5M' using conventional photolithographic-etching process to have openings 72. The remaining photoresist blocks 70 are less than about 0.1 λ. and are widely dispersed on the upper surface of the photoresist layer 62 to enable chemical removal (i.e., washing away) of the photoresist layers 62, 56, 50 and 44.

Next, a conductor 74 is deposited onto the portions of the conductor 68 exposed by the openings 72, and onto the portions of the photoresist layer 62 exposed by the openings 72 and also onto the photoresist 70 as shown in FIG. 5N' and also in FIG. 5M which shows the portion of the structure absent the photoresist 70.

Figure 5O:
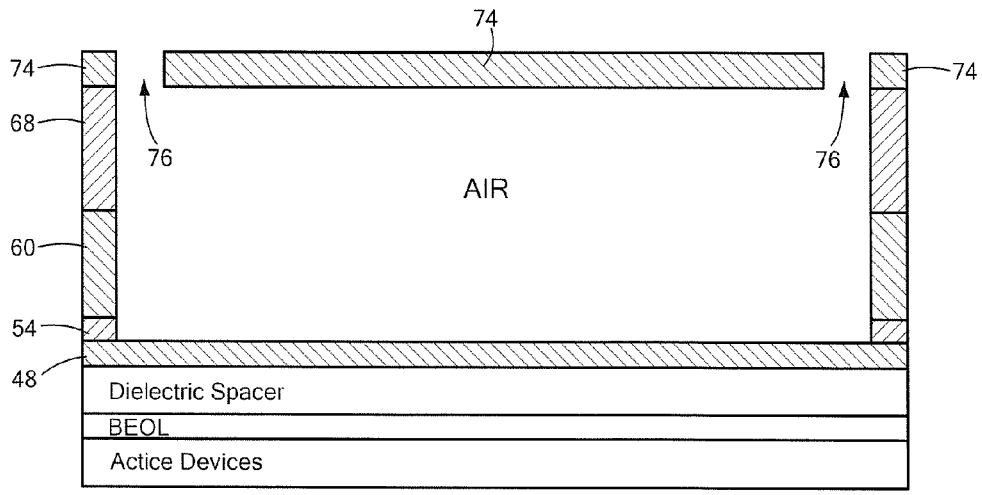

Next, photoresist layers 62, 56, 50 and 44 are chemical removed (i.e., washed away) through openings 76 (FIG. 5O') resulting in the structure shown in FIGS. N and 5O'.

The waveguide-based combiner may be monolithically grown on top of the active silicon chips by Nuvotronics using its PolyStrata process (Nuvotronics, LLC 7586 Old Peppers Ferry Loop, Radford, Va. 24141). The features of each stratum across the wafer are defined using photolithography with ±2 μm accuracy in X-Y alignment between layers. Once a stratum pattern is defined and developed, the photoresist is used as a mold for plating copper features. The copper is planarized using chemical-mechanical polishing (CMP) with the photoresist serving as a vertical stop for the CMP process. At this juncture, the photolithography process begins anew, and the steps repeat themselves. This process continues until the entire height of the structure has been achieved. The photoresist is then dissolved to leave air-filled copper structures.

Figure 6A:
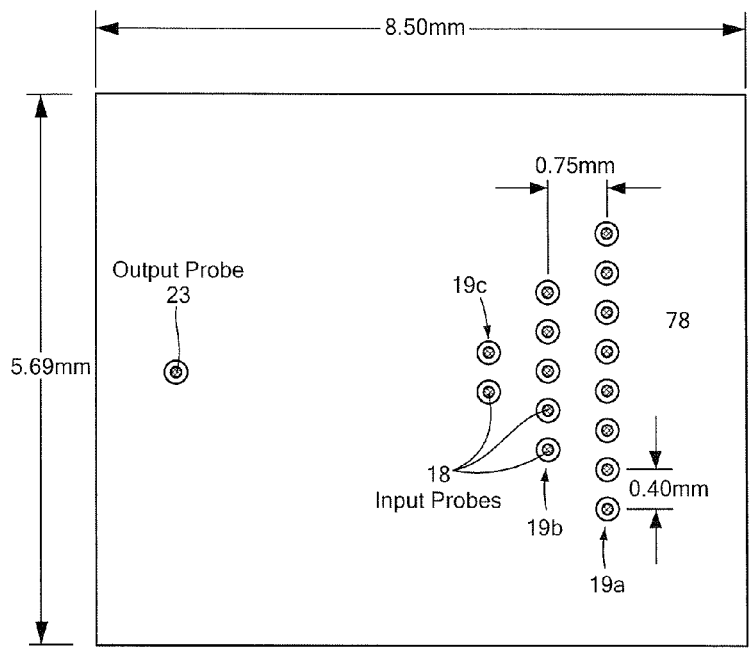
FIGS. 6A-6C show top, side and back views, respectively of the power combiner of FIG. 1
Figure 6B:
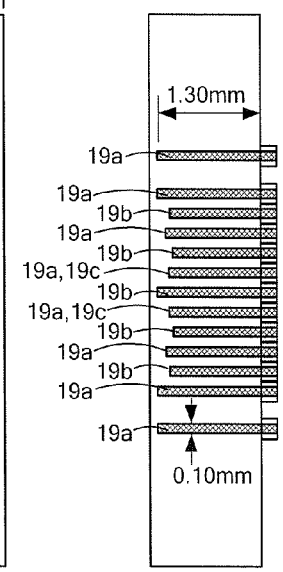
Figure 6C:
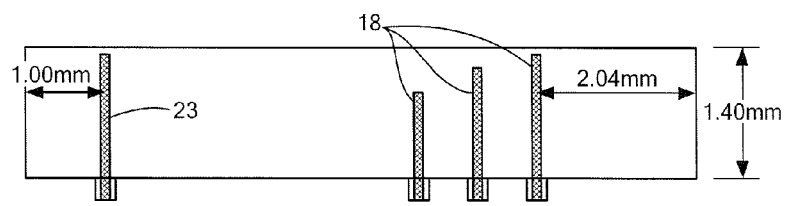

FIGS. 6A-6C show top, side and back views, respectively of a power combiner according to the disclosure having a nominal operating frequency of 45 GHz. Note that the probes 18 nearest the back or rear are higher that the probes 18 towards the front with the probes 18 in the row between the rear and front rows having a height intermediate the heights of the probes in the front and rear rows. Note also, that the process described in connection with FIGS. 5A-5M and 5M'-5O' is used to fabricated the probe 23.

A number of embodiments of the disclosure have been described. Nevertheless, it will be understood that various modifications may be made without departing from the spirit and scope of the disclosure. For example, while the structure 10 is described as a power combiner, it should be understood that the structure may be used to distribute or split power fed to probe 23 among the plurality of probes 18 under principles of reciprocity. Hence the microwave structure 10 is a power combiner/divider (or power combiner/splitter) structure. Still further, more or less probes 18 may be used combining/dividing different numbers of devices. Further, the top and sidewalls of the waveguide may be formed as a separate unit and then bonded to the bottom wall. Further, while the heights of the probes vary from the front row to the back row, the lengths of the probes may vary along any one of the rows. Still, further, while the ends of the probes are connected to transistors arranged as amplifiers, the ends of the probes may be connected to transistors arranged in other configurations, such as phase shifters or may be directly connected to a microwave transmission line as when the combiner/divider is used without transistors in a passive microwave structure. Accordingly, other embodiments are within the scope of the following claims.

What is claimed is:

1. A microwave structure, comprising:
   a waveguide for supporting microwave energy propagating along a predetermined direction through the waveguide;
   a plurality of parallel probes, each one of the plurality of parallel probes having an end projecting into the waveguide, each one of the plurality of parallel probes being disposed along a direction transverse to the predetermined direction;
   a plurality of transistors;
   wherein each one of the plurality of parallel probes being coupled to an electrode of a corresponding one of the transistors;
   wherein the plurality of parallel probes is disposed in a common region of the waveguide having the same electric field maxima.

2. A microwave structure, comprising:
   a waveguide having a rear wall;
   a plurality of parallel probes, each one of the plurality of parallel probes having a first end electrically coupled to an output and a second end projecting into the waveguide, the plurality of parallel probes being spaced from the rear wall a distance $n(\lambda/4) +/- 0.2\lambda$, where $\lambda$ is the nominal operating wavelength of energy passing between the plurality of parallel probes and the waveguide and n is an odd integer;
   a plurality of transistors and wherein the first end of each one of the plurality of parallel probes is electrically coupled to an output of a corresponding one of the plurality of transistors; and
   wherein for at least one value of n there is a plurality of the parallel probes.

3. The microwave structure recited in claim 2 wherein the plurality of transistors are arranged as amplifiers.

4. A microwave structure, comprising:
   a waveguide for supporting microwave energy propagating along a predetermined direction through the waveguide toward a rear end of the waveguide, a portion of the energy being reflected back into the waveguide at the rear end of the waveguide;
   a plurality of parallel probes, each one of the plurality of parallel probes having a first end electrically coupled to an output and a second end projecting into the waveguide, the plurality of parallel probes being spaced from the rear end a distance $n(\lambda/4) +/- 0.2\lambda$, where $\lambda$ is the nominal operating wavelength of energy passing between the plurality of parallel probes and the waveguide and n is an odd integer;
   a plurality of transistors and wherein the first end of each one of the plurality of parallel probes is electrically coupled to an output of a corresponding one of the plurality of transistors; and
   wherein for at least one value of n there is a plurality of the parallel probes.

5. A microwave structure, comprising:
   a waveguide for supporting microwave energy propagating along a first predetermined direction through the waveguide;
   a plurality of parallel probes, each one having a first end electrically coupled to an output and a second end projecting into the waveguide along a second predetermined direction different from the first predetermined direction, the plurality of parallel probes being disposed in a common region of the waveguide having maximum electric field and the plurality of parallel probes being disposed along a line transverse to the direction of the propagating microwave energy and transverse to both the first predetermined direction and the second predetermined direction; and a plurality of transistors and wherein the first end of each one of the plurality of parallel probes is electrically coupled to a corresponding one of the plurality of transistors.

6. The microwave structure recited in claim 5 wherein the plurality of transistors are arranged as amplifiers.

7. A microwave structure, comprising:
a rectangular waveguide;
a plurality of amplifiers;
a plurality of parallel probes, each one of the plurality of parallel probes having a first end electrically coupled to an output of a corresponding one of the plurality of amplifiers and a second end projecting outwardly into the waveguide, the plurality of parallel probes being disposed in a common region of the rectangular waveguide, such region having a common electric field maximum within the rectangular waveguide; and
wherein the plurality of parallel probes are arrayed along a direction perpendicular to narrow sidewalls of the rectangular waveguide and wherein energy passes through the rectangular waveguide along a direction parallel to the narrow sidewalls of the rectangular waveguide.

8. The microwave structure recited in claim 7 including a plurality of transistors and wherein the first end of each one of the plurality of parallel probes is electrically coupled to an output of a corresponding one of the plurality of transistors.

9. The microwave structure recited in claim 8 wherein the plurality of transistors are arranged as the plurality of amplifiers.

10. A microwave structure, comprising:
a waveguide having a rear wall;
a supporting structure;
a plurality of transistors disposed on the supporting structure;
a plurality of probes, each one of the plurality of probes having a first end electrically coupled to an output of at least one of the plurality of transistors and a second end projecting outwardly from the supporting structure and into the waveguide, the plurality of probes being spaced from the rear wall a distance $n(\lambda/4) +/- 0.2\lambda$, where $\lambda$ is the nominal operating wavelength of energy passing between the plurality of probes and the waveguide and n is an odd integer;
wherein a first portion of the plurality of probes has lengths different from a second portion of the plurality of probes; and
wherein for at least one value of n there is a plurality of the probes.

11. A microwave structure, comprising:
a waveguide having a rear wall;
a support structure;
a plurality of sets of transistors, each one of the sets of transistors having more than one transistor, the plurality of sets of transistors disposed on the support structure;
a corresponding plurality of sets of parallel probes, each one of the parallel probes in each one of the sets of parallel probes having a first end electrically coupled to an output of the plurality of transistors in the corresponding one of the plurality of sets of transistors, and a second end projecting outwardly from the support structure and into the waveguide, the parallel probes being spaced from the rear wall a distance $n(\lambda/4) +/- 0.2\lambda$, where $\lambda$ is the nominal operating wavelength of energy passing between the parallel probes and the waveguide and n is an odd integer; and
wherein for at least one value of n there is a plurality of the parallel probes.

12. The microwave structure recited in claim 11 wherein a first portion of the parallel probes has lengths different from a second portion of the parallel probes.

13. The microwave structure recited in claim 11 wherein the plurality of sets of transistors are arranged as amplifiers.

14. A microwave structure, comprising:
a waveguide having a rear wall;
a plurality of probes, each one of the plurality of probes having an end projecting outwardly into the waveguide, the plurality of probes being spaced from the rear wall a distance $n(\lambda/4) +/- 0.2\lambda$, where $\lambda$ is the nominal operating wavelength of energy passing between the plurality of probes and the waveguide and n is an odd integer;
wherein a first portion of the plurality of probes has lengths different from a second portion of the plurality of probes; and
wherein for at least one value of n there is a plurality of the probes.

15. A microwave structure, comprising:
a waveguide;
a plurality of parallel probes, each one of the plurality of parallel probes having an end projecting into the waveguide;
a plurality of transistors;
wherein each one of the plurality of parallel probes is disposed on an electrode of a corresponding one of the plurality of transistors;
wherein the plurality of parallel probes are spaced from an end of the waveguide a distance $n(\lambda/4) +/- 0.2\lambda$, where $\lambda$ is the nominal operating wavelength of energy passing between the plurality of parallel probes and the waveguide and n is an odd integer; and
wherein for at least one value of n there is a plurality of the parallel probes.

16. The microwave structure recited in claim 15 wherein the plurality of parallel probes are disposed in a common region of the waveguide having maximum electric field.

17. A microwave structure, comprising:
a waveguide;
a plurality of probes, each one of the parallel probes having an end projecting into the waveguide;
a plurality of transistors;
wherein each one of the plurality of probes is disposed on an electrode of a corresponding one of the plurality of transistors; wherein the plurality of probes are disposed in a common region of the waveguide having maximum electric field; and
wherein the waveguide is a rectangular waveguide and wherein the plurality of probes are arrayed along a direction perpendicular to narrow sidewalls of the rectangular waveguide and wherein energy passes through the waveguide along a direction parallel to the narrow sidewalls of the waveguide.

18. A microwave structure, comprising:
a waveguide;
a monolithic integrated circuit having a plurality of transistors;
a plurality of parallel probes, each one of the plurality of parallel probes having an end projecting outwardly and into the waveguide;

wherein each one of the plurality of parallel probes is disposed on an electrode of a corresponding one of the plurality of transistors wherein the plurality of parallel probes are spaced from a rear end of the waveguide a distance $n(\lambda/4) +/-0.2\lambda$, where $\lambda$ is the nominal operating wavelength of energy passing between the plurality of parallel probes and the waveguide and n is an odd integer; and wherein for at least one value of n there is a plurality of the parallel probes.

19. The microwave structure recited in claim 18 wherein the plurality of parallel probes are disposed in a common region of the waveguide having maximum electric field.

20. The microwave structure recited in claim 18 wherein the waveguide is a rectangular waveguide and wherein the plurality of parallel probes are arrayed along a direction perpendicular to narrow sidewalls of the rectangular waveguide and wherein energy passes through the rectangular waveguide along a direction parallel to the narrow sidewalls of the rectangular waveguide.

21. The microwave structure recited in claim 18 wherein the plurality of transistors are arranged as amplifiers.

22. The microwave structure recited in claim 21 wherein the waveguide includes a rear wall at the rear end and wherein each one of the plurality of parallel probes has an end projecting outwardly into the waveguide, the plurality of parallel probes are spaced from the rear wall a distance $n(\lambda/4) +/-0.2\lambda$, where $\lambda$ is the nominal operating wavelength of energy passing between the plurality of parallel probes and the waveguide and n is an odd integer.

* * * * *